(12) United States Patent
Topper et al.

(10) Patent No.: US 9,716,364 B2
(45) Date of Patent: Jul. 25, 2017

(54) OPTICALLY PUMPED SEMICONDUCTOR DISK LASER

(71) Applicant: Fraunhofer-Gesellschaft zur Forderung der angewandten Forschung e.V., Mullheim (DE)

(72) Inventors: Tino Topper, Freiburg (DE); Marcel Rattunde, Gundelfingen (DE); Sebastian Kaspar, Kirchzarten (DE); Joachim Wagner, Freiburg-Hochdorf (DE)

(73) Assignee: Fraunhofer-Gesellschaft Zur Förderung der Angewandten Forschung E.V., München (DE)

( * ) Notice: Subject to any disclaimer, the term of this patent is extended or adjusted under 35 U.S.C. 154(b) by 0 days.

(21) Appl. No.: 14/661,280

(22) Filed: Mar. 18, 2015

(65) Prior Publication Data

US 2015/0270677 A1    Sep. 24, 2015

(30) Foreign Application Priority Data

Mar. 18, 2014  (DE) .................. 10 2014 205 022

(51) Int. Cl.
*H01S 3/06* (2006.01)
*H01S 5/04* (2006.01)
(Continued)

(52) U.S. Cl.
CPC ............ *H01S 3/0604* (2013.01); *H01S 5/041* (2013.01); *H01S 5/18383* (2013.01); *H01S 5/34306* (2013.01); *H01S 5/02476* (2013.01)

(58) Field of Classification Search
CPC .......... H01S 3/091; H01S 3/025; H01S 3/042; H01S 3/0604; H01S 3/07; H01S 3/1628; H01S 5/183; H01S 5/187; H01S 5/343
See application file for complete search history.

(56) References Cited

U.S. PATENT DOCUMENTS 6,327,293 B1 * 12/2001 Salokatve et al. .............. 372/96
6,658,034 B2    12/2003 Garnache et al.
(Continued)

FOREIGN PATENT DOCUMENTS

DE        10260183      7/2004
DE      102004024611    3/2005
(Continued)

OTHER PUBLICATIONS

Schulz, N. et al., "High-Brightness Long-Wavelength Semiconductor Disk Laser", in: Laser and Photonics Review, vol. 2, 2008, No. 3, pp. 160-181.
(Continued)

*Primary Examiner* — Xinning Niu (74) *Attorney, Agent, or Firm* — Volpe and Koenig, P.C.

(57) ABSTRACT

An optically pumped semiconductor disk laser including a pump light source, at least one semiconductor body (2), which semiconductor body (2) has at least one window region (8), an active region (7) and a reflection device (P), which reflection device has at least one first P-reflection element (P1) for the pump wavelength. The first P-reflection element (P1) is embodied and arranged such that pump light emerging from the pump light source (3) can be guided for at least two passes through the active region (7). A total thickness of the active region (7) and of the window region (8) in the direction of an optical axis of the semiconductor disk laser is less than three times the laser wavelength in the active region (7).

15 Claims, 7 Drawing Sheets

(51) Int. Cl.
*H01S 5/183* (2006.01)
*H01S 5/343* (2006.01)
*H01S 5/024* (2006.01)

(56) References Cited

U.S. PATENT DOCUMENTS

| | | | |
|---|---|---|---|
| 7,522,646 B2 | 4/2009 | Brick et al. | |
| 2001/0043636 A1* | 11/2001 | Bewley | B82Y 20/00 372/70 |
| 2002/0071463 A1 | 6/2002 | Garnache et al. | |
| 2004/0233961 A1 | 11/2004 | Lutgen | |
| 2005/0281309 A1* | 12/2005 | Kim | B82Y 20/00 372/71 |
| 2007/0104241 A1* | 5/2007 | Kim | H01S 5/141 372/50.124 |

FOREIGN PATENT DOCUMENTS

| | | |
|---|---|---|
| DE | 102006002879 | 8/2007 |
| WO | 0247223 | 6/2002 |

OTHER PUBLICATIONS

Devautour, M. et al., "Thermal Management for High-Power Single-Frequency Tunable Diode-Pumped VECSEL Emitting in the Near- and Mid-IR", in: IEEE Journal of Selected TOPCS in Quantum Electronics, vol. 19, 2013, 1701108.

Tropper, A.C. et al., "Extended Cavity Surface-Emitting Semiconductor Lasers", In: Progress in Quantum Electronics, vol. 30, 2006, pp. 1-43.

Kuznetsov, M. et al., "High-Power Diode-Pumped Vertical External Cavity Surface Emitting Semiconductor Lasers with Circular TEM00 Beams", IEEE Photonics Technology Letters, vol. 9, No. 8, p. 1063 (1997).

Paajaste, J, et al., "High-Power and Broadly Tunable GaSb-Based Optically Pumped VESCELs Emitting near 2 μm", Journal of Crystal Growth 311, p. 1917 (2009).

Corzine, S.W. et al., "Design of Fabry-Perot Surface-Emitting Lasers with a Periodic Gain Structure", IEEE Jourunal of Quantum Electronics, vol. 25, p. 1513 (1989).

* cited by examiner

OPTICALLY PUMPED SEMICONDUCTOR DISK LASER

INCORPORATION BY REFERENCE

The following documents are incorporated herein by reference as if fully set forth: German Patent Application No. 102014205022.7, filed Mar. 18, 2014.

BACKGROUND

The invention is in the field of semiconductor lasers and relates to a semiconductor disk laser (SDL, or VECSEL—vertical cavity surface emitting laser).

Compared with edge emitting semiconductor lasers, semiconductor disk lasers are distinguished by an improved beam quality with a diffraction-limited beam and a circular intensity profile in conjunction with high output powers. By means of the size of the pumped area, semiconductor disk lasers can be scaled in terms of their power, the high beam quality being maintained at the same time. As a result, by diverse external resonator configurations, it is possible to satisfy a large number of complex requirements such as, for example, tuneability of the emission wavelength or mode-selective laser operation in conjunction with high output powers.

As known from the prior art, see for example M. Kuznetsov et al. "High-power diode-pumped vertical external cavity surface emitting semiconductor lasers with circular TEM00 beams", IEEE Photonics Technology Letters, Vol. 9, No. 8, page 1063 (1997), the semiconductor body of a semiconductor disk laser consists of three regions that are clearly separated in terms of their function:

A) a mirror region, which is highly reflective to an operating wavelength of the laser (laser wavelength). This region can optionally have further optical properties (such as e.g. a high reflectivity in a second wavelength range, see WO 02/47223 A1).

B) an active region, in which quantum wells (QW) and barrier or spacer layers adjoining them are situated. Further layers for specific functionalities can optionally be situated in the active region between the quantum wells and barrier layers (see e.g. J. Paajaste et al. "High-power and broadly tunable GaSb-based optically pumped VECSELs emitting near 2 µm", Journal of Crystal Growth 311, page 1917 (2009)). In this case, a thickness of the active region is defined from the beginning of the first to the end of the last barrier layer directly adjoining a quantum well. The thickness of the active region thus corresponds to the extent of the active region in the direction of an optical axis (parallel to the main emission direction, with preference parallel to the growth direction of the semiconductor layers, i.e. perpendicular to the wafer surface) of the semiconductor disk laser. Within the active region, in the case of the semiconductor disk laser, pump radiation is absorbed and laser radiation is generated. If the energy of the pump photons is above the band gap of the quantum wells and below the band gap of the barrier layers surrounding the quantum wells, then the pump light is absorbed only in the quantum wells. This is then referred to as so-called "in-well" pumped semiconductor disk lasers. If the energy of the pump photons is above the band gap of the barrier layers surrounding the quantum wells, pump light is absorbed both in the barrier layers and in the quantum well layers. Due to the layer thickness ratios of the barrier layers to the quantum wells, the main part of the pump light in this case is absorbed into the barrier layers, for which reason this configuration is referred to as "barrier-pumped" semiconductor disk lasers.

C) a window region, through which the laser radiation emerges from the structure and which simultaneously shields the active region as a surface from the surroundings. The window region is constructed from semiconductor layers that are transparent to the laser wavelength (i.e. the absorption is minimal). If an optical pumping process with pump photons having a pump wavelength takes place through the window region, then the latter must also be transparent to the pump wavelength. The semiconductor layers in the window region typically have a larger band gap than the last barrier layer of the active region, in order to prevent a diffusion of charge barriers to the surface e.g. in the case of barrier-pumped semiconductor disk lasers. Furthermore, the window region can be constructed such that it alters the reflectivity for the laser wavelength and/or the pump wavelength (e.g. AR for the laser wavelength in WO 02/47223 A1). In many embodiments, the window region is closed off by a thin cap layer at the interface with air. This cap layer has the task of preventing possible oxidation of underlying semiconductor material. The thickness of the window region is defined by the adjoining active region and by the end of the semiconductor body, i.e. the surface as interface of the semiconductor body with the surroundings. The thickness of the window region thus corresponds to the extent of the window region in the direction of an optical axis (parallel to the main emission direction) of the semiconductor disk laser.

A total thickness of active region and window region thus corresponds to the extent of the active region and of the window region in the direction of an optical axis (parallel to the main emission direction) of the semiconductor disk laser.

It is likewise known to adapt the length of the semiconductor structure in such a way that for the laser light a resonance within the semiconductor structure and thus a standing wave field for a laser field intensity form in order to increase the absorption of the pump light. Absorption efficiencies of the pump light in the range of 65-95% are typically striven for. By way of example, WO 02/47223 discloses directing the pump light through the active region a second time in order to increase the absorption efficiency.

What is disadvantageous about the semiconductor disk lasers according to the prior art is that the maximum output power in the case of semiconductor disk lasers more particularly in the MIR wavelength range between 1.9 and 2.8 µm is limited in comparison with other laser concepts. Likewise, the scalability of the output power by the size of the pumped area has been limited heretofore.

SUMMARY

The present invention is therefore based on the object of providing a semiconductor disk laser which enables the output power to be increased and has an improved scalability of the output power, more particularly in the MIR wavelength range.

This object is achieved by a semiconductor disk laser having one or more features of the invention. Preferred configurations of the semiconductor disk laser according to the invention are found below and in the claims. The wording of the claims is hereby explicitly incorporated by reference in the description as if fully set forth.

The invention stems from the applicant's insight that a high power efficiency and a high output power can be achieved in the case of semiconductor disk lasers by the pump light being guided through the active region at least a second time and the semiconductor structure embodied with a reduced total thickness of the active region and of the window region.

Applicant's investigations have surprisingly shown that, in contrast to what is proposed in the prior art, a larger total thickness of the semiconductor structure does not lead to higher powers and power efficiencies, rather that higher output powers are achieved precisely with a reduced total thickness of the active region and of the window region.

The semiconductor disk laser according to the invention is embodied as an optically pumped semiconductor disk laser and comprises a pump light source, at least one semiconductor body having an active region, a window region and a reflection device, which reflection device has a first P-reflection element for the pump wavelength, wherein the first P-reflection element is embodied and arranged in such a way that pump light emerging from the pump light source can be guided in at least two passes through the active region.

What is essential is that the total thickness of the active region and of the window region in the direction of an optical axis of the semiconductor disk laser is less than three times the laser wavelength in this medium.

The thickness of the active region and/or the total thickness of the active region together with the window region is usually specified as a multiple of the laser wavelength $\lambda$ in the medium, i.e. in the relevant material system. According to the invention, therefore, the total thickness of the active region and of the window region is $L_{total} < 3 \cdot \lambda$. The conversion into real layer thicknesses can be carried out by the emission wavelength of the laser in air $\lambda_L$ and the refractive indices of the individual layers n, wherein it holds true that: $\lambda = \lambda_L / n$.

The semiconductor body is preferably constructed as a semiconductor layer structure. However, it is likewise within the scope of the invention for the semiconductor body to comprise layers and/or constituents which are not embodied in a semiconductor material. In this case, the thickness of the window region is defined by the adjoining active region and by the end of the semiconductor body, i.e. the surface as interface of the semiconductor body with the surroundings. Possible additional coatings adjoining the window region of the semiconductor body which are not embodied in a semiconductor material do not belong to the window region and therefore also do not alter the window region thickness according to the invention.

The reduced total thickness of the active region together with adjoining window region affords the following advantages with regard to the laser properties of the semiconductor disk laser:

the internal optical losses are reduced since the absorption of free charge carriers in the active region decreases on account of the reduced total thickness.

the internal efficiency increases since non-radiative recombinations of charge carriers in the active region are reduced on account of the reduced total thickness.

the shortened active region leads to improved heat dissipation since the distance relative to a heat spreader which is typically situated on the top side or the underside of the structure, is shortened.

for a given size of the optical pump spot, the reduced total thickness leads to a heat outflow that is more like a purely one-dimensional heat outflow, compared with a significantly greater influence of the three-dimensional heat flow in the case of a longer active region. The scalability of the output power of the semiconductor disk laser by means of the size of the pumped area is improved as a result, since the one-dimensional heat flow significantly improves the scalability.

However, these advantages of a thinner structure lead to a higher output power only if at the same time the pump light is guided through the active region at least one further time. It is only by this means that the disadvantage of a thinner structure—the lower absorption efficiency of the pump light on account of the shorter length of the absorption path—is compensated for again. A high pump light absorption is essential in order to achieve a high power efficiency.

In one preferred embodiment, the barrier layers and/or the quantum wells within the active region are constructed from semiconductor material of the group of the III-V compound semiconductors. This affords the advantage that the wavelength can be set in a wide range by the choice of a suitable composition of the semiconductor layers.

In one preferred embodiment, the semiconductor layers are substantially produced from the III antimonide material system, that is to say that the quantum wells and barriers are produced from GaSb, GaInSb, GaInAsSb, AlGaAsSb or AlAsSb. This affords the advantage that laser emission in the wavelength range around 2 μm or higher can be achieved.

In a further preferred embodiment, the semiconductor disk laser is embodied as a barrier-pumped semiconductor disk laser, that is to say that the pump light is principally absorbed in the barrier layers adjoining the quantum wells. In the case of barrier-pumped semiconductor disk lasers, the reduction of the thickness of the active region together with the window region means that the pump light is absorbed to a greater percentage directly in the quantum wells. As a result, for the same number of quantum wells, the absorption in the barrier layers decreases, such that the importance of recombination losses in the barrier layers decreases.

In a further preferred embodiment, the first P-reflection element of the reflection device is embodied as a mirror, more particularly as a multilayer mirror, preferably as a double-band dielectric mirror (distributed Bragg reflector). More particularly preferably, the first P-reflection element is embodied in such a way that it has a high reflectivity, more particularly higher than 95%, preferably higher than 97%, for the pump wavelength, preferably for the pump wavelength and the laser wavelength. The double-band dielectric mirror can be applied to the semiconductor layers by subsequent coating or can be formed with preference by means of an epitaxial growth method. What is advantageous here is that a double pass of the pump light through the active region can be achieved by virtue of the high reflectivity of the double-band dielectric mirror for the pump wavelength. The pump light runs from the pump light source into the active region and is reflected in the active region on the double-band dielectric mirror and passes through the active region through a second pass. Alternatively, broadband-reflecting layers (e.g. metallic coatings) can also be used, or a combination of the possibilities described.

In a further preferred embodiment, the semiconductor disk laser comprises a second P-reflection element for the pump wavelength, wherein the active region is arranged between first P-reflection element and second P-reflection element, and first P-reflection element, active region and second P-reflection element are embodied and arranged in a cooperating manner such that the pump light experiences a multiple pass through the active region in the operating state. With preference, the second P-reflection element is embodied by a semiconductor-air interface of the semiconductor body that faces away from the first P-reflection element. As a result of the different refractive indices of air and semiconductor material, said interface acts as a mirror. What is advantageous here is that no additional optical component is required for fulfilling the resonance condition. Alternatively, an additional further coating or a Bragg mirror is applied on the top side of the semiconductor body.

With preference, first P-reflection element, active region and second P-reflection element are embodied and arranged in a cooperating manner such that a resonance forms for the pump wavelength. The pump light is reflected and the reflected, returning wave is superimposed with the incoming wave of the pump light. If the resonance condition is fulfilled, a standing wave forms for the pump light (also called micro cavity resonance for the pump wavelength). The absorption of the pump radiation and thus the power efficiency of the semiconductor disk laser increase significantly as a result of this resonance.

In a further preferred embodiment, the layer thicknesses of the semiconductor body are adapted such that a resonance for the laser wavelength forms within the active region. It is furthermore advantageous to position the quantum wells at the antinodes of the resulting standing wave field of the laser wavelength. This design (also called "Resonant Periodic Gain", RPG) increases the modal gain of the structure and thus reduces the laser threshold. The advantage of this structure is that the intensity of the laser light at the location of the quantum wells and thus the modal gain of the structure can thereby be increased (see e.g. S. W. Corzine et al. "Design of Fabry-Perot surface-emitting lasers with a periodic gain structure", IEEE Journal of quantum electronics, Vol. 25, page 1513 (1989))

In a further preferred embodiment, a transparent heat spreader (e.g. comprised of diamond or silicon carbide, SiC) is applied to the semiconductor body in order to improve the heat outflow. What is advantageous here is that the shorter distance to the surface of the semiconductor body and thus to the heat spreader and to the first reflection element as a result of the shortened length of the active region leads to a lower thermal resistance. The heat dissipation improves as a result of the low thermal resistance. Therefore, it is possible to use pump light sources having higher pump light intensities in comparison with the prior art, and thus to achieve an increased output power. With preference, the heat spreader is embodied as an intracavity heat spreader, i.e. the intracavity heat spreader is applied on that side of the semiconductor body which faces away from the first P-reflection element within the laser resonator. With preference, a second heat spreader is arranged on that side of the semiconductor body which faces away from the first heat spreader. For this purpose, it is advantageous for the substrate on which the semiconductor body was grown to be partly or completely removed in order to further improve the heat dissipation.

In a further preferred embodiment, the total thickness of the active region together with the adjoining window region is reduced further, with preference embodied with a thickness of <2.5·λ, with very high preference <2·λ, preferably <1.5·λ, more particularly preferably <1·λ, with preference <0.5·λ.

In a further preferred embodiment, a quantum deficit, that is to say an energetic difference between pump and laser photons, is less than 50%, with preference less than 40%, with preference less than 30%, with preference less than 20%. With preference, the active region comprises at least a number of barrier layers and a number of quantum wells, wherein a first band gap of the barrier layers and a second band gap of the quantum wells differ by less than 50%. By virtue of the small difference between the first band gap of the barrier layers and the second band gap of the quantum wells, it is possible to reduce the quantum deficit of the barrier-pumped semiconductor disk laser. A smaller quantum deficit is possible as a result of the low-energy pump photons. The external power efficiency of the semiconductor disk laser thus increases. The lower laser threshold and the increase in the output power are advantageous here.

In a further preferred embodiment, in the active region the barrier layers are substantially embodied from GaSb or GaInAsSb and the quantum wells are substantially embodied from GaInSb or GaInAsSb. With the use of this material system, the barrier layers have a smaller band gap than in alternative material systems such as e.g. AlGaAsSb. As a result, it is possible to use a pump laser correspondingly adapted to the barrier material, such as e.g. a laser having a higher emission wavelength in the region of 1.5 μm. For the same emission wavelength of the quantum wells, the quantum deficit thus decreases and higher pump powers can be used.

In a further preferred embodiment, the total thickness of active region and window region is less than 1/200 of the diameter of the pump beam on the surface of the semiconductor body. The total thickness of active region and window region is thus very much less than the diameter of the pumped region, which substantially corresponds to the diameter of the light beam of the pump light source. What is advantageous here is that the heat flow from the active region to a heat sink, e.g. preferably via an intracavity heat spreader or a heat spreader below the dielectric mirror, is approximated to a purely one-dimensional heat flow. The scalability of the output power of the semiconductor disk laser by means of the size of the pumped area is improved as a result. With preference, the total thickness of active region and window region is less than 1/300 of the diameter of the pump beam on the surface of the semiconductor body, with very high preference less than 1/400 of the diameter of the pump beam on the surface of the semiconductor body, particularly preferably less than 1/500 of the diameter of the pump beam on the surface of the semiconductor body.

In a further preferred embodiment, the absorption efficiency of the pump light is greater than 70%, with preference >90%, with preference >95%.

In a further preferred embodiment, the semiconductor disk laser is embodied in such a way that the pump light impinges on the active region at an angle of incidence with respect to the optical axis, which angle of incidence corresponds to an optimum spectral resonance for the pump wavelength. More particularly preferably, the angle of incidence for the pump light is optimized depending on the temperature and the semiconductor layer structure. That is to say that an optimum spectral position of the resonance for the pump wavelength is set by means of an angle of incidence of the pump light and/or the temperature of the semiconductor layer. "Optimum spectral resonance" means here that the resonance for the pump wavelength attains a maximum, in particular a global maximum depending on the angle of incidence. The maximum here is the point at which the resonance after an initial rise undergoes transition to a fall depending on the angle of incidence of the pump light and the temperature of the semiconductor layer structure. This affords the advantage that almost complete absorption of the pump light occurs despite the shortened length of the active region.

In a further preferred embodiment, the barrier-pumped semiconductor disk laser has an active region having a length $L_{act}$[m], wherein $$L_{act} = -\ln(1-\eta_{abs})/(2\alpha(\lambda) \cdot \Gamma_{abs}(\lambda))$$

with the aborption efficiency of the pump photons in the active region $\eta_{abs}$[%], the average absorption coefficient of the active region $\alpha(\lambda)$[m$^{-1}$] and $\Gamma_{abs}(\lambda)$[-] as increase factor for the absorption of the pump light as a result of the resonance.

This affords the advantages, more particularly, that as a result of the multiple pass of the pump light and the formation of the resonance of the pump light in the active region of the semiconductor disk laser, the length of the active region $L_{act}$ can be seen significantly shortened, while with preference the required length of the absorption path $S_{abs}$ within the active region for a predefined value of the pump light absorption efficiency $\eta_{abs}$ remains substantially the same.

In the context of this description, the length of the active region is the length of the path along the optical axis of the semiconductor disk laser which runs in the active region of the semiconductor layer structure, designated by $L_{act}$.

In the context of this description, the required length of the absorption path $S_{abs}$ within the active region is the length traversed by the pump light in the active region. The length $S_{abs}$ is determined by means of the material-specifically defined absorption coefficient $\alpha(\lambda)$[m$^{-1}$] of the pump photons in the active region by virtue of the fact that a predefined value of the absorption efficiency $\eta_{abs}$ is intended to be achieved:

$$s_{abs} = -\ln(1-\eta_{abs})/\alpha(\lambda)$$

BRIEF DESCRIPTION OF THE DRAWINGS

Further preferred features and embodiments of the semiconductor disk laser according to the invention are explained below on the basis of exemplary embodiments and the figures, in which.

DETAILED DESCRIPTION OF THE PREFERRED EMBODIMENTS

In FIGS. 1 to 7, identical reference signs designate identical or identically acting elements.

Figure 1:
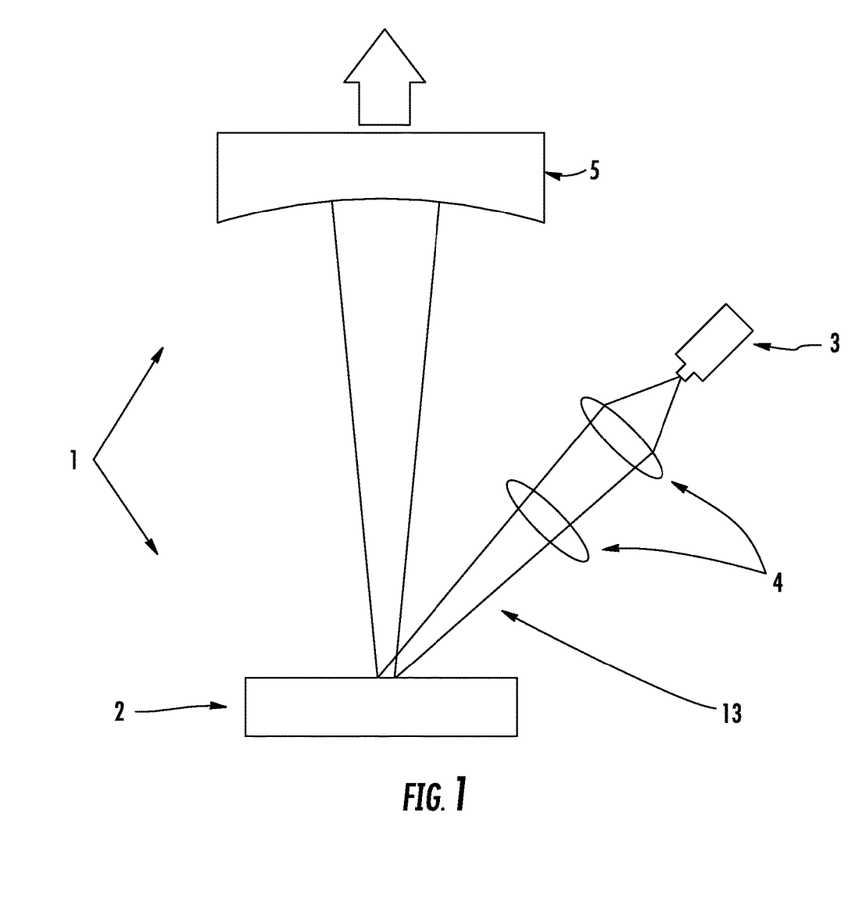
FIG. 1 shows a schematic illustration of a first exemplary embodiment of a semiconductor disk laser according to the invention comprising a linear resonator.

FIG. 1 schematically shows the basic construction of a first exemplary embodiment of a semiconductor disk laser comprising a linear laser resonator 1. The semiconductor disk laser comprises a semiconductor body 2, a pump light source 3, in the present case a laser, a pump optical unit 4 and also an external mirror 5. The laser radiation 13 emitted by the pump light source 3 passes through the pump optical unit 4 and is focused in the semiconductor body 2. The laser resonator 1 is formed by a mirror that is part of the semiconductor body 2 and also the external mirror 5. The laser resonator 1 can likewise be embodied as an arrangement comprising a plurality of external mirrors or further optical elements. The semiconductor body 2 is optically pumped by means of the pump laser 3 and the pump optical unit 4. A pump spot diameter can vary very greatly depending on the pump laser 3, e.g. between 50 μm and 200 μm. In the present case, the pump spot diameter is approximately 550 μm. In the present case, the laser resonator 1 for the laser wavelength has an extent along the optical axis of typically a few cm in length, but significantly shorter (length in the region of 100 μm) or significantly longer (length of a few 10 to 100 cm) resonators can also be realized.

Figure 2:
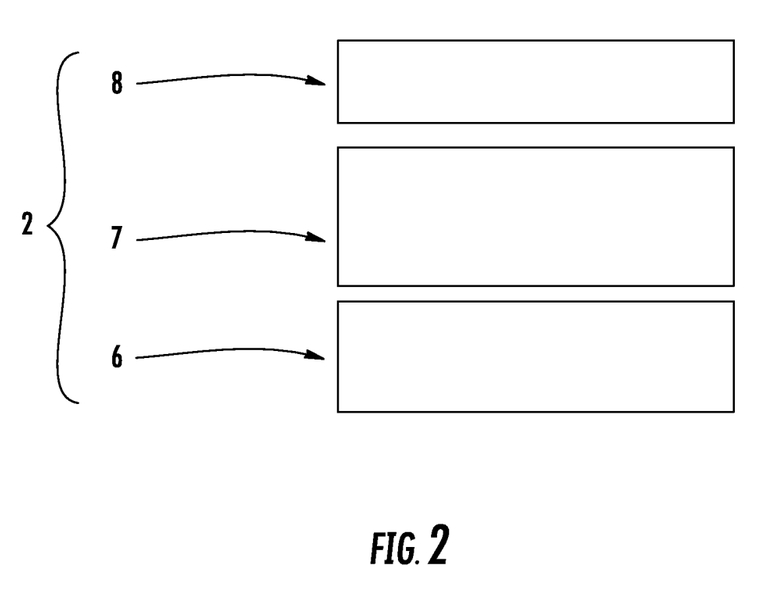
FIG. 2 shows a schematic illustration of a previously known semiconductor arrangement (prior art)

FIG. 2 shows the basic construction of the semiconductor body 2. The latter comprises a mirror region 6, which is embodied such that it is highly reflective for the laser wavelength. The active region 7 is embodied as adjacent to said mirror region. In the active region 7, the pump radiation is absorbed and the laser radiation is generated. The window region 8 is arranged on the active region, said window region forming the topmost region of the semiconductor structure. The mirror 6 is embodied from semiconductor material in the form of a Distributed Bragg Reflector (DBR), from III-V semiconductor material in the present case, but can also be embodied in the form of a dielectrically vapor-deposited or metallic mirror or consist of a combination of these possibilities. The window region 8 is embodied from III-V semiconductor material in the present case.

Figure 3:
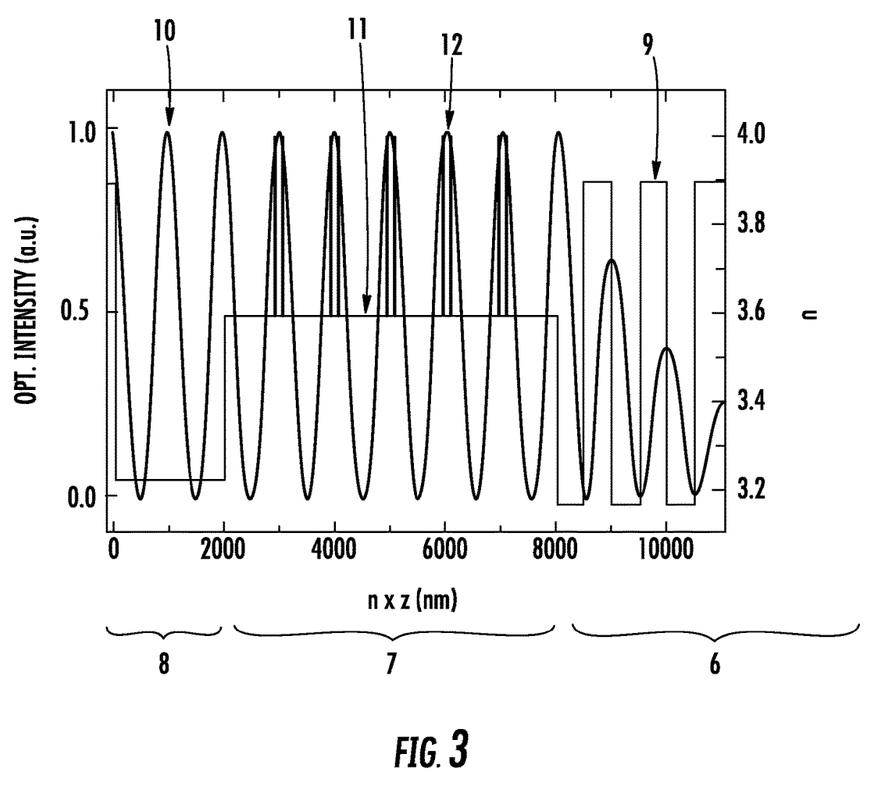
FIG. 3 shows the profile of the refractive index and the intensity distribution of the laser field in a previously known semiconductor arrangement (prior art)

FIG. 3 illustrates by way of example the profile of the refractive index n 9 and the intensity distribution of the laser field 10 in a previously known semiconductor arrangement (prior art). The mirror region 6 (only the first layer pairs thereof can be seen) and the active region 7 with the barrier layers 11 and quantum wells 12 are identified. In this example, the active region 7 has a thickness of $6 \cdot \lambda/2 = 3\lambda$, wherein $\lambda$ is the laser wavelength in the relevant material system. The semiconductor structure is closed off by the window region 8, which in this example consists of a material having a high band gap (and thus a relatively low refractive index) and a thin cap layer and overall has a thickness of $2 \cdot \lambda/2$. In this example, the thicknesses of the semiconductor layers are adapted such that for the laser light a resonance within the semiconductor structure and thus a standing wave field for the laser field intensity are formed. Furthermore, the quantum wells are arranged at antinodes (RPG design). The total thickness of the active region 7 together with the adjoining window region 8 (or, to put it another way, the thickness of the entire semiconductor structure 2, excluding the mirror region 6) is $8\lambda/2 = 4 \cdot \lambda$.

Figure 4:
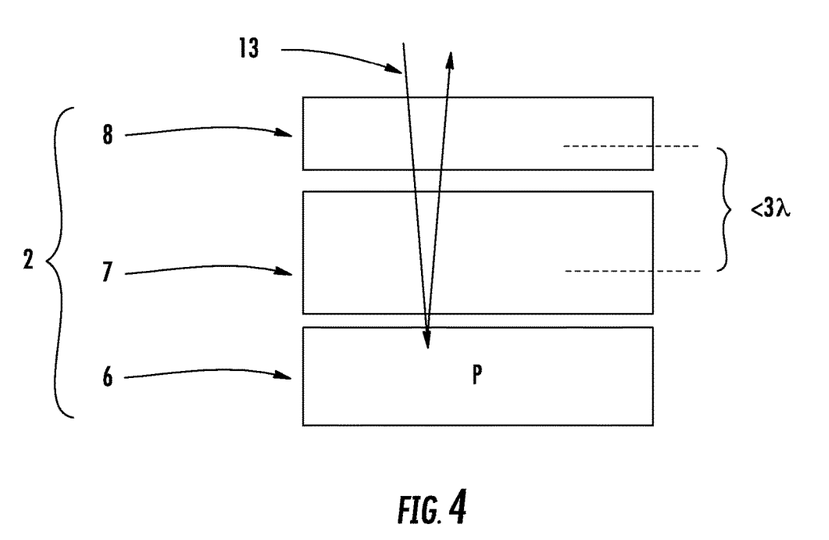
FIG. 4 shows a schematic illustration of a first exemplary embodiment of a semiconductor body with illustration of the double pass of the pump light through the active region.

FIG. 4 shows a schematic illustration of a first exemplary embodiment of a semiconductor arrangement with illustration of the pump light. The semiconductor body 2 has the reduced total thickness according to the invention of window region and active region: the thickness of the active region 7 together with the thickness of the window region 8 (or, to put it another way, the thickness of the entire semiconductor structure 2, excluding the mirror region 6) in terms of absolute value is less than 3·λ, wherein λ is the laser wavelength in the relevant material system. The semiconductor body 2 is embodied in such a way that the pump light is guided through the active region 7 at least a second time with the aid of the reflection device P. The reflection device P comprises the first P-reflection element, which is embodied as the mirror 6. The mirror 6 has a high reflectivity both for the laser light and for the pump light 13. The pump light 13 is therefore guided through the active region 7 at least a second time.

Figure 5:
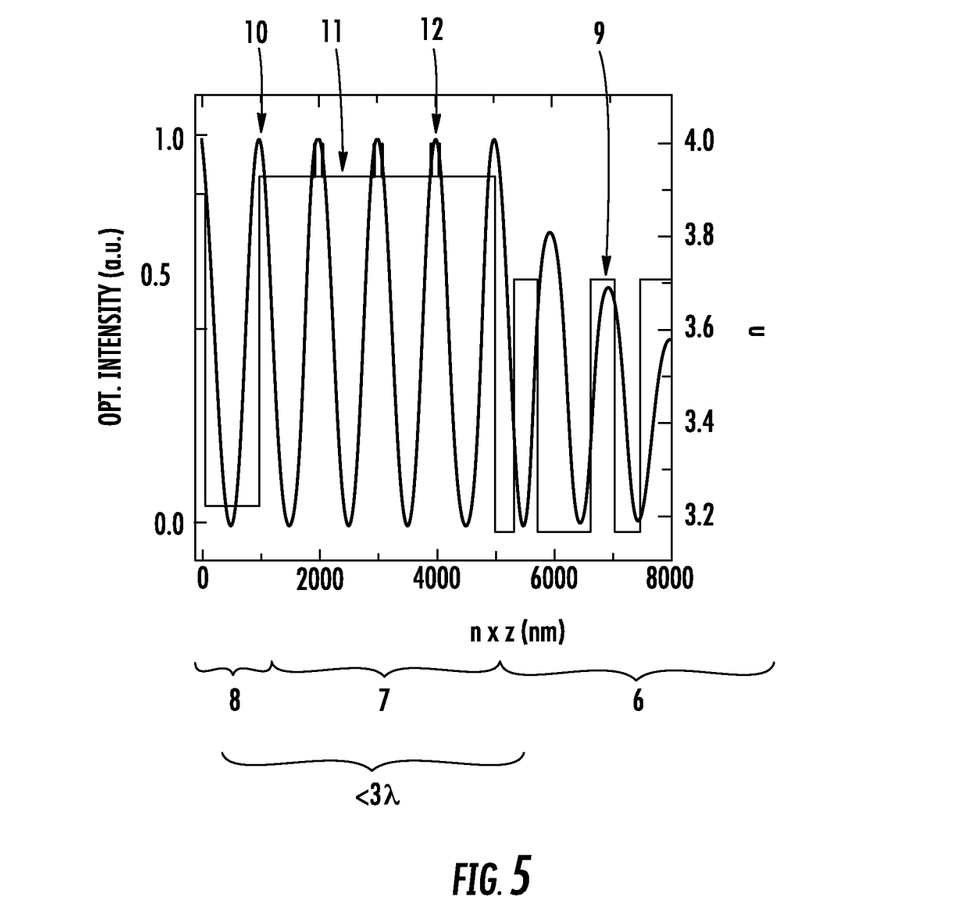
FIG. 5 shows the profile of the refractive index and the intensity distribution of the laser field in one exemplary embodiment of the semiconductor body according to the invention.

FIG. 5 illustrates the profile of the refractive index n 9 and the intensity distribution of the laser field 10 in one embodiment of the arrangement in accordance with FIG. 4. The mirror region 6 (in the case of which once again only the first layers are illustrated) is embodied in this case such that it has a high reflectivity both for the laser light and for the pump light. As a result, the pump light is guided through the active region 7 at least a second time. The active region 7 having the barrier layers 11 and quantum wells 12 has a thickness of 4·λ/2, and the adjoining window layer (including a cap layer contained in the window layer 8) has a thickness of λ/2. The thickness of the active region 7 together with the thickness of the window region 8 (or, to put it another way, the thickness of the entire semiconductor structure 2, excluding the mirror region 6) is therefore 5·λ/2 and is less than 3·λ.

For an emission wavelength $\lambda_L$ of 2.0 µm, this structure can consist e.g. of a 260 nm thick window layer (8) (consisting e.g. of 10 nm GaSb and 250 nm AlGaAsSb having a refractive index n of 3.89 and 3.24, respectively) and of a 1070 nm thick active region (7), which in turn consists of GaSb (n=3.89) and of GaInSb quantum wells (n=4.0). The mirror region consists of a plurality of layers of AlAsSb and AlGaAsSb.

Figure 6:
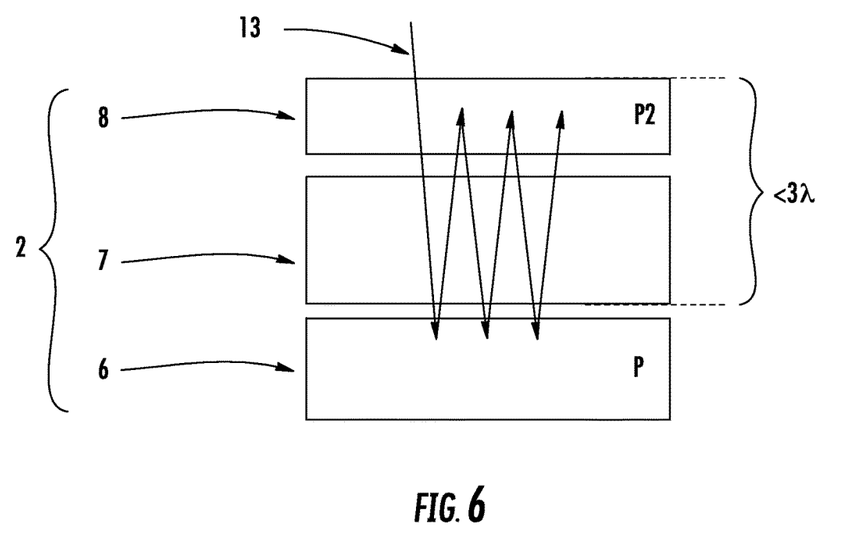
FIG. 6 shows a schematic illustration of a further exemplary embodiment of a semiconductor body with a multiple pass of the pump light through the active region.

FIG. 6 shows a schematic illustration of a further exemplary embodiment of a semiconductor arrangement. In this case, the mirror 6 is configured such that it has a high reflectivity both for the laser light and for the pump light 13 and therefore, as in FIG. 4, constitutes a P-reflection element P for the pump light. Furthermore, the window region 8 is configured such that it constitutes a further P-reflection element P2 for the pump light, e.g. by virtue of the pump light being reflected at the semiconductor-air interface at the surface of the window layer 8. This results in a multiple pass of the pump light 13 through the active region 7. The thicknesses of the semiconductor layers in the active region 7 and the window layer 8 are adapted in such a way that a resonance of the pump light arises. The intensity of the pump light (as in an etalon) in the active region 7 is additionally increased as a result of the resonance. The thickness of the active region 7 together with the thickness of the window region 8 (or, to put it another way, the thickness of the entire semiconductor structure 2, excluding the mirror region 6) is less than 3·λ, wherein λ is the laser wavelength in the relevant material system.

Figure 7:
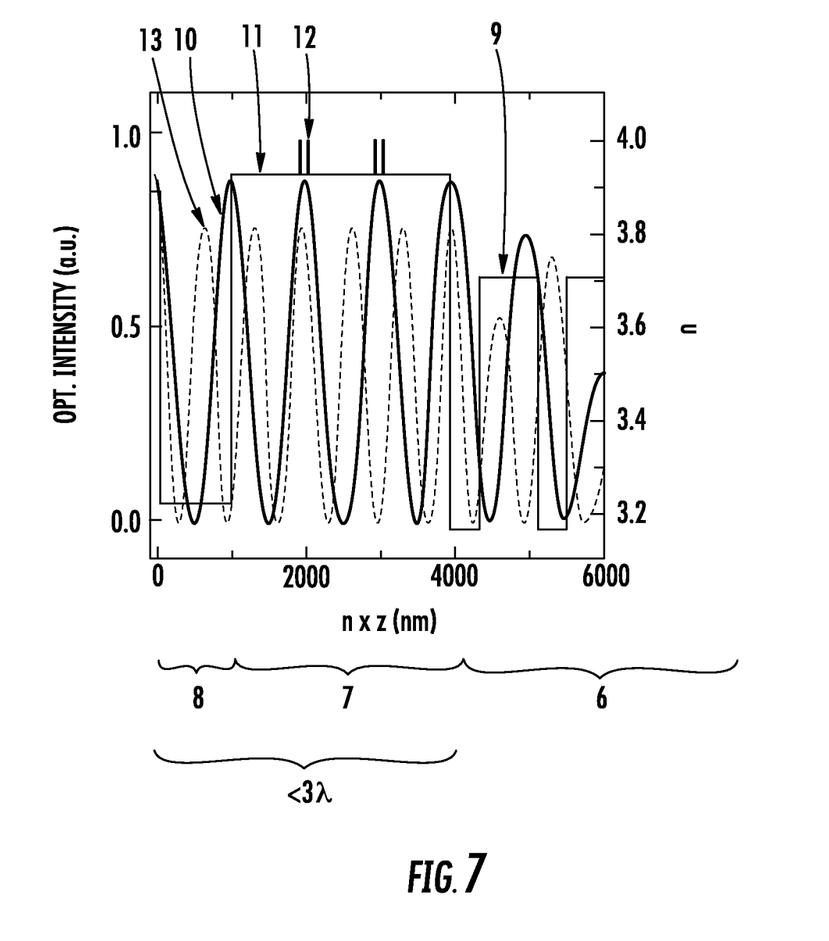
FIG. 7 shows the profile of the refractive index and the intensity distribution of the laser field and of the pump light field in one preferred embodiment in accordance with FIG. 6.

FIG. 7 shows the profile of the refractive index 9 and the intensity distribution of the laser field 10 in the abovementioned preferred embodiment in accordance with FIG. 6. By virtue of the two-band mirror 6 (high reflection for laser light and pump light), the reflection of the pump light at the semiconductor-air interface at the end of the window layer 8 and also as a result of the adapted layer thicknesses in the active region 7 and the window region 8, a standing wave field (resonance) forms not only for the laser light 10, but also for the pump light 13. As a result, the pump light 13 is guided multiply through the active region 7. The active region 7 having the barrier layers 11 and quantum wells 12 has a thickness of 3·λ/2, and the adjoining window region (including the cap layer) has a thickness of λ/2. The thickness of the active region 7 together with the thickness of the window region 8 (or, to put it another way, the thickness of the entire semiconductor structure 2, excluding the mirror region 6) is therefore 4·λ/2 and is less than 3·λ.

The invention claimed is:

1. An optically pumped semiconductor disk laser comprising
   a pump light source, at least one semiconductor body (2), said semiconductor body (2) has at least one window region (8) that is transparent to pump light and laser light, an active region (7) and a reflection device (P), said reflection device has at least one first P-reflection element (P1) for a pump wavelength, wherein the first P-reflection element (P1) is embodied and arranged such that the pump light emerging from the pump light source (3) is guided for at least two passes through the active region (7), and
   a total thickness of the active region (7) and the at least one window region (8) in a direction of an optical axis of the semiconductor disk laser is less than three times a laser wavelength in the active region (7).

2. The optically pumped semiconductor disk laser as claimed in claim 1, wherein the active region (7) comprises at least a number of barrier layers and a number of quantum wells, and the barrier layers are substantially comprised of GaSb or GaInAsSb or AlGaAsSb or AlGaInAsSb and the quantum wells are substantially comprised of GaInSb or GaInAsSb.

3. The optically pumped semiconductor disk laser as claimed in claim 1, wherein the reflection device (P) of the semiconductor body (2) as the first P-reflection element (P1) for the pump wavelength is embodied as a double-band dielectric mirror (6).

4. The optically pumped semiconductor disk laser as claimed in claim 1, wherein the semiconductor disk laser is embodied as a barrier-pumped semiconductor disk laser.

5. The optically pumped semiconductor disk laser as claimed in claim 1, wherein the thickness of the active region (7) and of the window region (8) in the direction of an optical axis of the semiconductor disk laser is less than 2.5 times the laser wavelength in this medium (<2.5).

6. The optically pumped semiconductor disk laser as claimed in claim 1, wherein the active region (7) comprises at least a number of barrier layers and a number of quantum wells, wherein a first band gap of the barrier layers and a second band gap of the quantum wells differ by less than 50%.

7. The optically pumped semiconductor disk laser as claimed in claim 6, wherein the semiconductor body (2) is embodied such that a resonance arises for the laser light and the quantum wells are arranged in the active region (7) according to the resonant periodic gain concept.

8. The optically pumped semiconductor disk laser as claimed in claim 7, wherein dissipation of heat from the semiconductor body (2) takes place via the reflection device (P).

9. The optically pumped semiconductor disk laser as claimed in claim 6, wherein a semiconductor material from the group of the III-V compound semiconductors is used as material for at least one of the barrier layers or the quantum wells.

10. The optically pumped semiconductor disk laser as claimed in claim 1, wherein the semiconductor disk laser is embodied such that the pump light impinges on the active region (7) at an angle of incidence, said angle of incidence corresponds to an optimum spectral resonance for at least the pump wavelength.

11. The optically pumped semiconductor disk laser as claimed in claim 1, wherein the total thickness of active region (7) and the window region (8) is less than $\frac{1}{200}$ of a diameter of a pump beam on the surface of the semiconductor body (2).

12. The optically pumped semiconductor disk laser as claimed in claim 1, wherein an absorption efficiency of the pump light is greater than 70%.

13. The optically pumped semiconductor disk laser as claimed in claim 3, wherein the double-band dielectric mirror (6) is a distributed Bragg reflector, and the reflection region for the pump wavelength and for the laser wavelength has a reflectivity of >95%.

14. The optically pumped semiconductor disk laser as claimed in claim 1, wherein the first P-reflection element (P1) for the pump light is embodied as a dielectric or metallic mirror (6) or a combination of a dielectric mirror and a metallic mirror or as a combination of a dielectric mirror, a metallic mirror and a double-band dielectric mirror.

15. The optically pumped semiconductor disk laser as claimed in claim 1, wherein dissipation of heat from the semiconductor body (2) takes place by a heat spreader arranged on that side of the active region (7) which faces away from the first reflection element (P1).

* * * * *